United States Patent [19]

Dumortier et al.

[11] Patent Number: 4,717,841
[45] Date of Patent: Jan. 5, 1988

[54] STATIC POWER SWITCH APPARATUS

[75] Inventors: Bernard Dumortier, Mareil Marly; Jean-Noël Gast, Rueil Malmaison; François Sauvel, Chatou, all of France

[73] Assignee: La Telemecanique Electrique, France

[21] Appl. No.: 899,371

[22] PCT Filed: Nov. 29, 1985

[86] PCT No.: PCT/FR85/00339
 § 371 Date: Aug. 5, 1986
 § 102(e) Date: Aug. 5, 1986

[87] PCT Pub. No.: WO86/03631
 PCT Pub. Date: Jun. 19, 1986

[30] Foreign Application Priority Data

Dec. 5, 1984 [FR] France ............................ 84 18520

[51] Int. Cl.⁴ ........................................ H03K 17/72
[52] U.S. Cl. ................................ 307/646; 307/647
[58] Field of Search .......... 307/252 B, 252 N, 252 T, 307/252 UA, 311; 323/235, 236, 319, 325; 363/128

[56] References Cited

U.S. PATENT DOCUMENTS

| | | | |
|---|---|---|---|
| 3,221,183 | 11/1965 | White | 307/252 T |
| 3,307,042 | 2/1967 | Fogleman | 307/252 T |
| 3,328,606 | 6/1967 | Pinckaers | 307/252 T |
| 3,524,997 | 8/1970 | Harnden, Jr. et al. | 307/252 B |
| 3,648,075 | 3/1972 | Mankovitz | 307/252 UA |
| 3,693,060 | 9/1972 | Joyce | 307/252 T |
| 3,801,832 | 4/1974 | Joyce | 307/252 T |

Primary Examiner—John Zazworsky
Attorney, Agent, or Firm—William A. Drucker

[57] ABSTRACT

The disclosure relates to a static power switch circuit having a power switch member having a bidirectional power switch with at least one controlled semiconductor of the thyristor or triac type with power terminals connected to an AC source in series with a load and a circuit for controlling the power switch member having a first control switch whose current path is connected to the gate of the power semiconductor through a full wave rectifier bridge, this switch being connected to a circuit able to generate control energy of the switch in response to an input signal.

4 Claims, 7 Drawing Figures

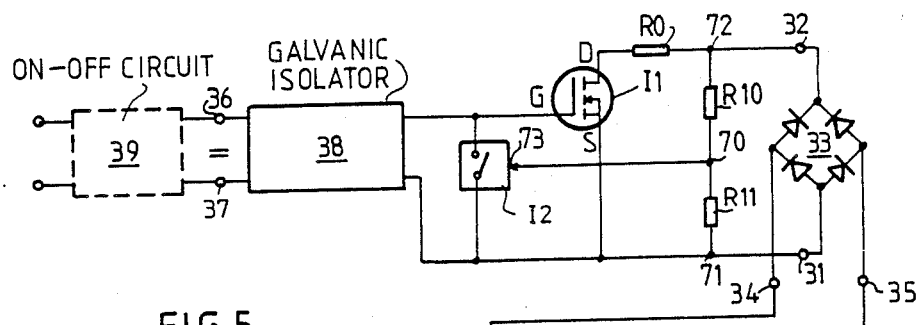
FIG.5
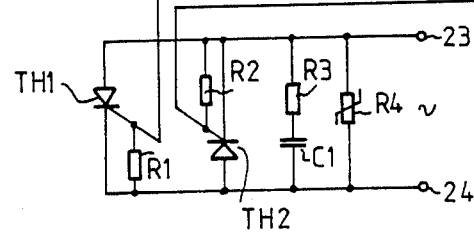
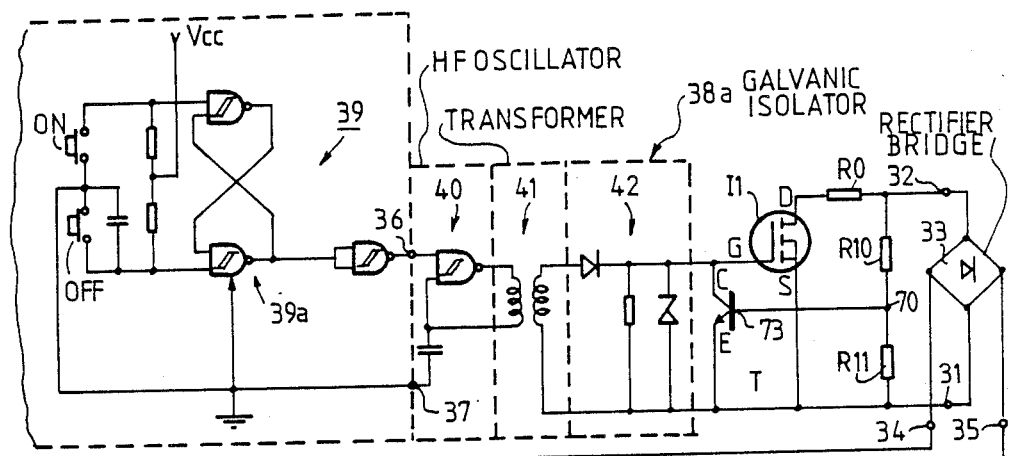
FIG.6
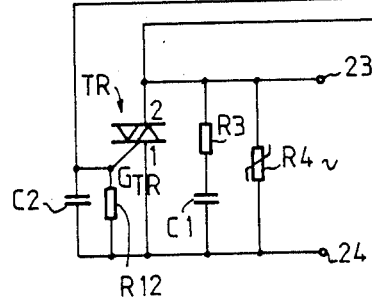

STATIC POWER SWITCH APPARATUS

The present invention relates to a static power switch apparatus comprising controlled semiconductor components and usable as single pole or multipole static relay or contactor for alternatig currents.

In power switching it is known to use static relays having a bidirectional power switch member comprising controlled semiconductor components, this power switch member being formed by two antiparallel thyristors or by a triac whose power terminals are connectable to a source of AC electric power in series with a load.

Generally, the power required for switching on the power semiconductor components comes either from a transfer through the control circuit of the gates of the semiconductor components, or from a leak current through the load.

In the first case, the power required has little relation with the levels available at the outputs of the circuits of electronic detection, measurement or data processing equipment.

In the second case, it is necessary to use a very sensitive control state for reducing as much as possible the leak current and including the most often a sensitive thyristor able to respond to the difficult compromise between resistance to high peak voltages, resistance to high dV/dts and a low gate current.

However, in the absence of a control signal, the energy for switching on the sensitive thyristor is derived in an inhibition circuit; the presence of the control signal suppresses this inhibition.

The purpose of the present invention is in particular to avoid these drawbacks and to create a static power switch apparatus for alternating currents having a power stage comprising controlled semiconductor component and a circuit controlling this power stage, the control circuit using a positive logic switch with low control energy reducing as much as possible the leak current through the power circuit.

In the case where it is desired to control switching on of the power semiconductor component close to the voltage zero, the purpose of the invention is to add to the positive logic switch an appropriate circuit for allowing polarizable switching on by high impedance means for minimizing the leak current of the power circuit.

The invention relates to a static power switch circuit including;
- a power stage having a bidirectional power switch unit comprising at least one controlled semiconductor component of the thyristor or triac type whose power terminals may be connected to an AC source in series with a load,
- a circuit for controlling the power switch unit, this circuit having a first control switch whose current path is connected to the gate of the power semiconductor component through a full wave rectifier bridge, this switch being connected to a circuit able to generate control energy of the switch in response to an input signal.

According to the invention, the control switch is a field-effect transistor with isolated gate, preferably of the high voltage MOS type, whose drain-source path is connected to the DC voltage terminals of the rectifier bridge for being connected through the bridge and at least one current limiting member at the gate(s) of the semiconductor component(s) and whose gate is connected to an output of the control energy generating circuit, which circuit comprises a galvanic isolating means.

The connection of the drain-source path of the MOS is achieved in the case of two thyristors mounted in antiparallel with the gates of these two thyristors and in the case of a triac with the gate and the electrode No. 2 of the triac.

The control circuit associated with the controlled semiconductor components thus allows the control switch to be supplied with low energy of a level equivalent to that practiced in optically-coupled isolators.

It is particularly simple and inexpensive when it comprises a transformer without ferromagnetic core or a piezoelectric ceramic for transmitting to the gate of the MOS a control signal while ensuring galvanic isolation with respect to the circuit delivering the input signal.

A second control switch may advantageously be disposed in parallel with the source-gate current path of the first MOS control switch, the second switch being controlled by a signal representative of the voltage across the DC voltage terminals of the rectifier bridge for closing with time lags accurately corresponding to 180° when this voltage exceeds a predetermined threshold close to zero. It will be understood that the controlled semiconductor components are thus switched in the vicinity of the voltage zero of the AC source with a minimum of drift of the current in the non conductive state of the semiconductor components, through using a very high impedance bridge.

The invention will be better understood in the light of the following description.

In the accompanying drawing:

FIG. 5 shows the diagram of an apparatus similar to that of FIG. 1 and having a device for switching at voltage zero with low current drift;

FIG. 6 shows a triac apparatus switching at the voltage zero in response to the actuation of on and off control members of the control circuit;

Figure 1:
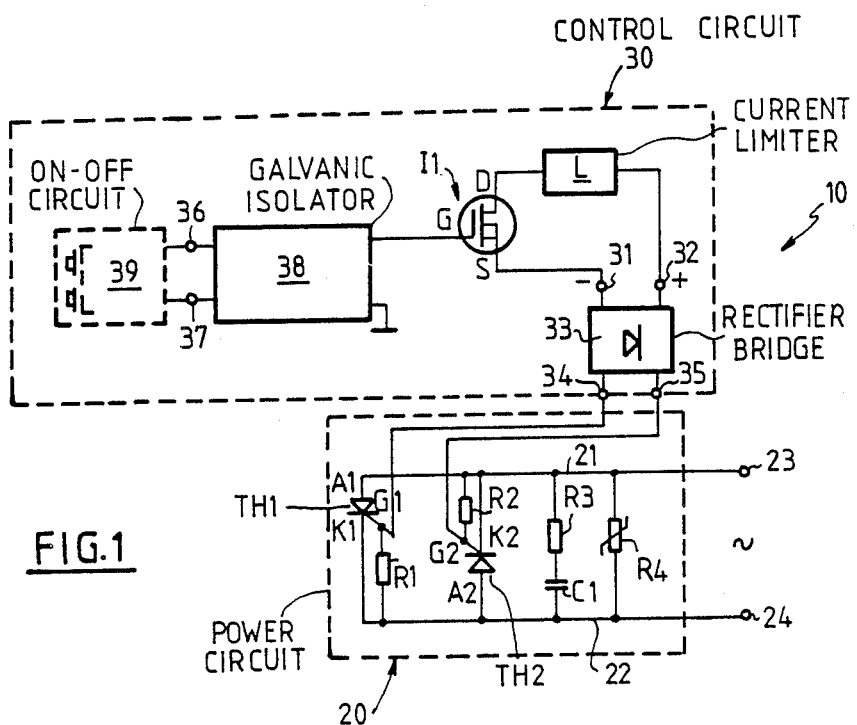
FIG. 1 shows the diagram of a static power switch apparatus of the invention comprising two thyristors head to tail and a MOS field-effect transistor control circuit.

The switch apparatus 10 shown in FIG. 1 has a power stage 20 with silicon-controlled rectifiers, or SCR, and a control circuit 30 having an isolated gate field-effect control transistor, for example of the high voltage MOS type, for biasing the gates of the SCRs in response to an input signal.

The power stage 20 has, in this embodiment, two thyristors mounted in antiparallel TH1, TH2 whose anodes A1, A2 and cathodes K1, K2 are connected to conductors 21, 22 themselves connected to the power terminals 23, 24 of the switch apparatus. These terminals are intended to be connected to an AC source, for example to the low voltage AC mains and to a load not shown. The gates G1, G2 of the thyristors TH1, TH2 are connected, on the one hand, to the output terminals of the control circuit 30 and on the other via respective emitter by-passing resistors R1, R2 to the conductors 22, 21. In parallel with the thyristors TH1, TH2 there is provided a series circuit R3, C1 protecting against the dV/dts and a protective element R4 protecting against overvoltages.

The control circuit 30 includes an MOS transistor control switch I1 whose drain and source terminals are connected through a linear or non linear current limiting member L (FIG. 1) formed for example by a resistor RO in the FIGS. 2 to 7, to the DC voltage terminals 31, 32 of a full wave rectifier bridge 33; the AC voltage terminals 34, 35 of bridge 33 form the output terminals of a control circuit 30. It goes without saying that the resistor RO may also be disposed between the rectifier bridge 33 and gates G1, G2. Resistor RO which serves for limiting the current may be formed partly or wholly by the resistance of the control MOS in the ON state and/or an additional MOS transistor disposed in series with the control MOS.

In this case, the control MOS will have to be designed so as to present in the ON condition a relatively high drain-source resistance with respect to that of the usual field-effect transistors used for switching. The advantage of such a solution consists in that it allows the cost price of the MOS transistor used and consequently of the whole of the circuit to be considerably lowered.

To the gate G of the MOS transistor is applied a control signal elaborated as a function of a low energy input signal applied at the input terminals 36, 37 of a galvanic isolating member 38.

The low energy input signal applicable to terminals 36, 37 is formed either by the DC signal supplied by an output interface of a programmable controller or by a sensor, or after rectification by the output AC signal of such an interface or by a signal delivered by an on-off circuit 39 and suitably amplified.

Figure 2:
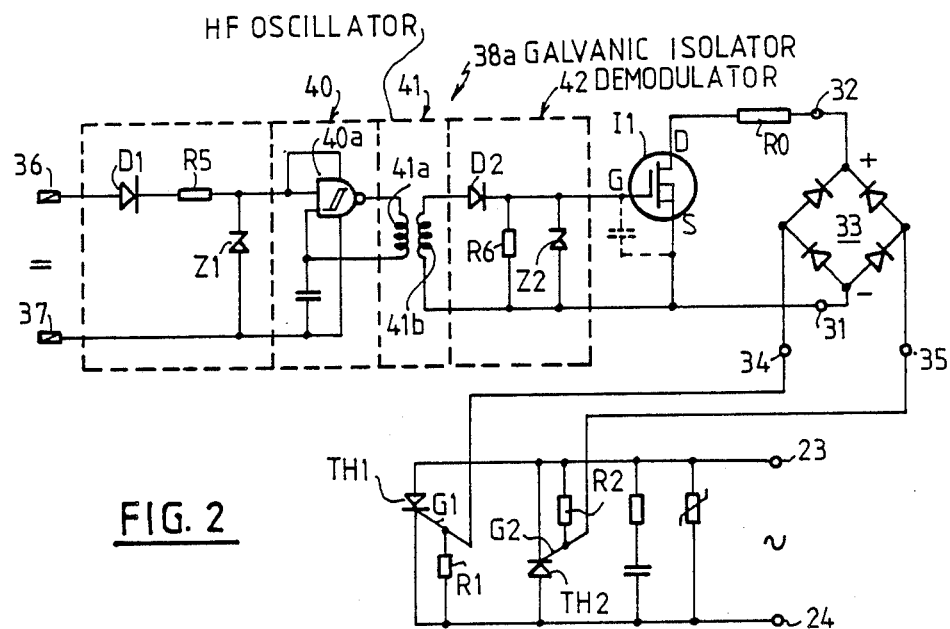
FIGS. 2, 3 and 4 show an apparatus in accordance with FIG. 1, having a control circuit whose isolating member is respectively a transformer without ferromagnetic core, an optically-coupled isolator with photovoltaic cells and a piezoelectric ceramic.
Figure 3:
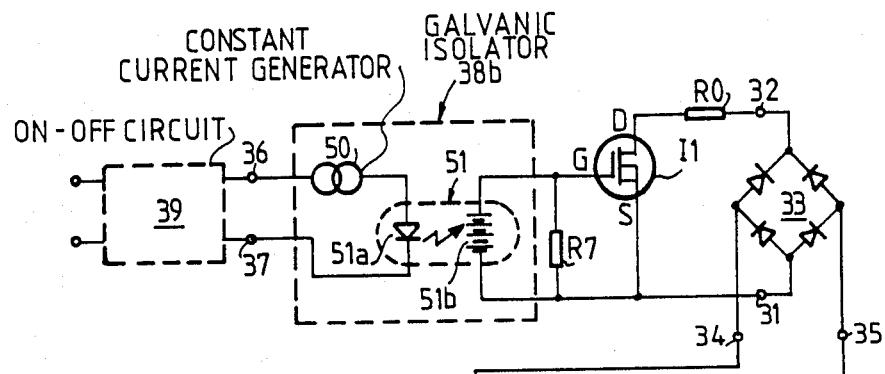
Figure 3:
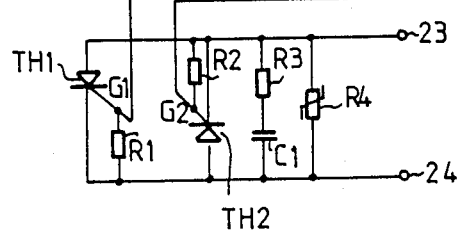
Figure 4:
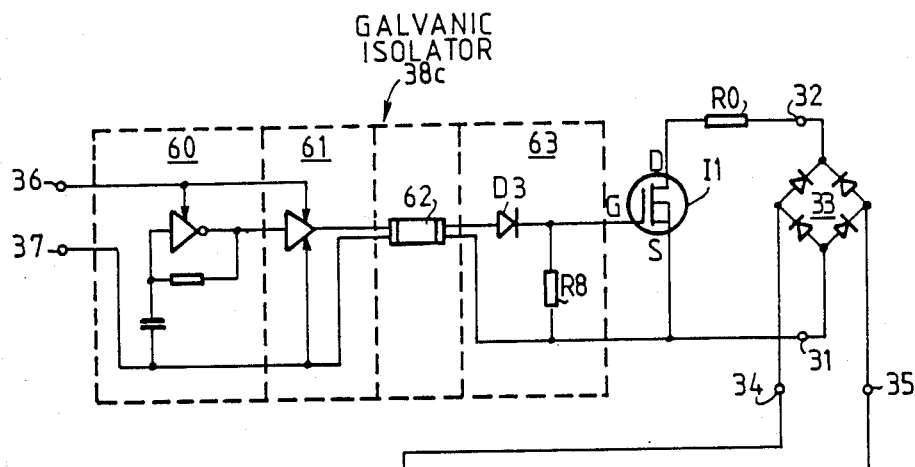
Figure 4:
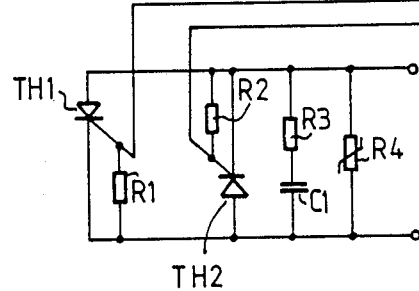

FIGS. 2 to 4 illustrate three embodiments of the isolating and control energy transmitting member 38.

In FIG. 2, the galvanic isolating member 38a includes a high frequency oscillator 40, a colorless transformer 41 and a demodulating circuit 42; this circuit is of the type described in the French patent application FR No. 84 07278 filed on the 11th May 1984 for "Control Device for static switch" in the name of the Assignee.

The oscillator 40 operates for example at a frequency higher than 100 KHz and has a Schmitt trigger inverter gate 40a whose inputs are connected to the terminals 36, 37 via an supply clamping diode D1, a limiting resistor R5 and, in parallel, a Zener diode Z1; the output of the inverter gate 40a is looped to one of its inputs via the primary winding 41a of the coreless transformer. The secondary winding 41b of the coreless transformer, isolated from the primary winding by a dielectric foil or carcase of a predetermined thickness, is connected to the gate G and source S terminals of the MOS transistor I1 through the circuit 42; this latter includes a rectifier diode D2 in parallel with a resistor R6, a protective Zener diode Z2 and the gate-source capacitance of the MOS transistor.

The switch apparatus of FIG. 2 operates in the following way. A DC input signal is applied to the terminals 36, 37 for example from an output interface of a programmable controller. The signal chopped by the Zener diode Z1 is applied to oscillator 40 which produces in the primary winding 41a of the coreless transformer 41 an oscillation at a frequency higher than 100 KHz. The secondary winding collects an oscillating signal which is rectified by diode D2, smoothed by the resistor R6 and the gate-source capacitance of the MOS transistor I1 while being chopped if necessary by the Zener diode Z2. The gate G driven by the control signal establishes the source-drain current path so that the power circuit is closed for example for a half wave by terminal 23, resistor R2, the terminals 35 and 32 of the rectifier bridge, the resistor RO, the drain-source path of the MOS, the terminals 31 and 34 of the bridge and the gate G1 of the thyristor TH1; this latter becomes conducting till the end of the half wave considered.

The galvanic isolating member 38b of FIG. 3 has a current limiting member or constant current generator 50 in series with the photo-emitter element 51a of a photocoupler 51. The terminals of the receiving element 51b of the photocoupler formed by an assembly of photovoltaic cells are connected to the gate G and to the source S of the MOS transistor and to the terminals of a resistor R7 in parallel with the gate-source path of the MOS.

The galvanic isolating member 38c of FIG. 4 comprises successively an oscillator 60 of the inverter gate type mounted as a Schmitt trigger, a current amplifier 61, a piezoelectric ceramic 62 and a rectifying and limiting circuit 63 provided with a diode D3 connected to the gate G and a resistor R8 in parallel with the gate-source circuit of the MOS. The piezoelectric ceramic 62 ensures the isolated transmission of the high frequency signal delivered by oscillator 60 and amplified by the amplifier 61 in response to a control signal appearing at the terminals 36, 37 connected directly to a programmable controller output interface.

In the embodiment of FIG. 5, a second control switch I2 has been associated in parallel with the gate-source circuit of the control switch I1. The control of this switch is provided by any means producing a signal representative of a predetermined voltage threshold at the DC terminals of the rectifier bridge 33, preferably by means of a voltage divider bridge R10, R11 whose end points 71, 72 are connected to the DC terminals 31, 32 of the full wave rectifier bridge 33 and whose middle point 70 is connected to a control terminal 73 of the switch I2.

The switch apparatus of FIG. 5 operates as follows. When the potential difference at the power terminal 23 of the apparatus becomes positive and exceeds a predetermined threshold of the order of a few volts, with thyristor TH2 driven reversely and so blocked, there appears at the terminal 73 via the emitter by-pass resistor R2, the rectifier bridge 33 and the divider bridge R10, R11 a signal causing switch I2 to close and thus inhibiting turning ON of the MOS transistor I1 and, consequently, inhibiting the triggering on of thyristor TH1. Conversely, when the potential difference at terminal 23 is less than the threshold, switch I2 is open and the MOS transistor I1 is turned ON when a control signal is present at terminals 36, 37.

It will be noted from the circuit described that the windows allowing switching on of the thyristors TH1, TH2 are symmetrical.

In the embodiment shown in FIG. 6, switch I2 is advantageously formed by a bipolar transistor T whose base 73 is connected to the middle point of the divider bridge R10, R11. The galvanic isolating and energy transmitting member 38a may be formed by a photovoltaic cell, optically-coupled isolator or by a piezoelectric ceramic; it is here shown in the form of a coreless transformer 41 whose primary winding is the looped output of oscillator 40, the terminals of the secondary winding of the transformer are respectively connected by a demodulating circuit to gate G and to source S of the MOS transistor I1, as well as to the collector C and to the emitter E fo the bipolar transistor T.

The on-off circuit 39 of of FIG. 6 includes an on switch and an off switch as well as a validation flip flop 39a. Such a circuit is more fully described in the patent application above referred to. The on and off switches are push buttons or optically controlled semiconductor components, for example phototransistors controlled by optical fibers.

The power stage of the apparatus of FIG. 6 includes a triac TR whose gate GTR is connected, on the one hand, to the AC terminal 34 of the rectifier bridge 33, and on the other, to the power terminal 24 of the apparatus through a resistor R12 in parallel with a capacitor C2. Capacitor C2 is optional and could then be omitted.

Figure 7:
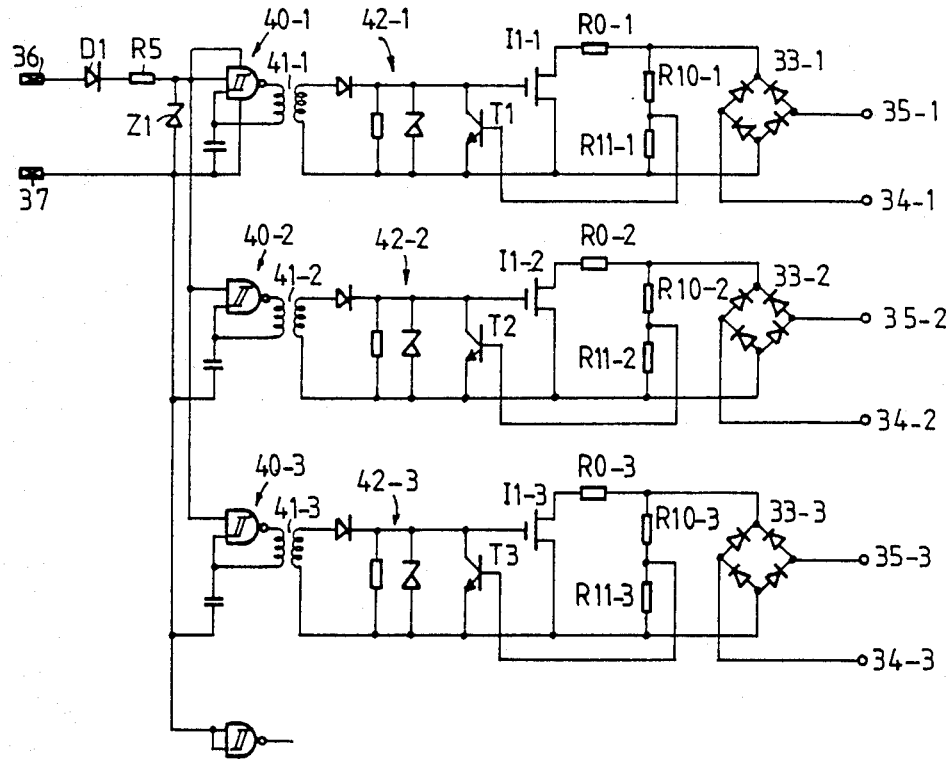
FIG. 7 shows the control circuit of a three pole static contactor controlled by a programmable controller output interface, with switching at voltage zero.

The switch apparatus shown in FIG. 7 is a three pole static contactor which may be associated with a DC output interface of a programmable controller. Each pole comprises a high frequency oscillator 40-1, 40-2, 40-3, a coreless transformer 41-1, 41-2, 41-3 and a demodulating circuit 42-1, 42-2, 42-3 for applying a control signal to an isolated gate field-effect MOS transistor, I1-1, I1-2, I1-3. The drain-source circuit of each MOS is connected to the DC terminals of a respective full wave rectifier bridge 33-1, 33-2, 33-3 through a limiting resistor RO-1, RO-2, RO-3. The AC terminals of the three rectifier bridges are connected to the output terminals respectively 34-1, 35-1; 34-2, 35-2; 34-3, 35-3 of the three control circuits for the associated pairs of head to tail thyristors or for the triacs of the power stage of the apparatus. The symmetrical switching at the voltage zero is obtained by means of three transistors T1, T2, T3 mounted as described above.

A single coreless transformer may be provided with a single primary winding and three secondary windings well isolated from each other.

It goes without saying that modifications may be made to the embodiments described. Thus, in an embodiment facilitating integration of the control circuit, for the bipolar transistor T switching at the voltage zero there is substituted a normally blocked field-effect transistor, for example of the low voltage MOS type, whose gate is connected to the intermediate point 70 of the voltage divider and whose main electrodes are connected to the gate and to the source of the high voltage MOS.

We claim:

1. A static power switch apparatus comprising:
  i. first and second alternating current power supply leads;
  ii. first and second thyristors each having an anode, a cathode and a gate, the anode of the first thyristor and the cathode of the second thyristor being connected to the first power supply lead while the cathode of the first thyristor and the anode of the second thyristor are connected to the second power supply lead;
  iii. a full wave rectifier bridge having first and second alternating current terminals and first and second direct current terminals; the first and second alternating current terminals being respectively connected to the respective gates of the first and second thyristors;
  iv. a MOS transistor having a gate and a source-drain current path and means comprising current limiter means, connecting said current path to the direct current terminals of said rectifier bridge;
  v. control means connected to the gate of the MOS transistor and responsive to a control signal for switching ON the MOS transistor and
  vi. first resistor means connecting the gate of the first thyristor to the second power supply lead and second resistor means connecting the gate of the second thyristor to the first power supply lead.

2. A static power switch apparatus as claimed in claim 1, wherein said current limiter means comprises the drain-source resistance of the MOS transistor.

3. A static power switch apparatus as claimed in claim 1, wherein said control means comprises a high frequency oscillator having an enabling terminal to which said control signal is applied and an output, a coreless transformer having primary and secondary windings, said primary winding being connected to the oscillator output and demodulator means connecting the secondary winding to the gate of said MOS transistor.

4. A static power switch apparatus as claimed in claim 3, wherein said oscillator comprises a Schmitt trigger inverter gate and generates a wave signal having a frequency higher than 100 KHz.

* * * * *